United States Patent
Hagy

(10) Patent No.: US 6,490,105 B2
(45) Date of Patent: Dec. 3, 2002

(54) STAGE MIRROR RETENTION SYSTEM

(75) Inventor: Scott A. Hagy, Ocoee, FL (US)

(73) Assignee: Nikon Precision Inc., Belmont, CA (US)

( * ) Notice: Subject to any disclaimer, the term of this patent is extended or adjusted under 35 U.S.C. 154(b) by 120 days.

(21) Appl. No.: 09/817,042

(22) Filed: Mar. 27, 2001

(65) Prior Publication Data

US 2002/0141082 A1 Oct. 3, 2002

(51) Int. Cl.⁷ ................................................. G02B 7/02
(52) U.S. Cl. ...................................... 359/827; 359/822
(58) Field of Search ................................ 359/819, 822, 359/827

(56) References Cited

U.S. PATENT DOCUMENTS

| 5,528,118 | A | * | 6/1996 | Lee | 318/38 |
| 5,623,853 | A | * | 4/1997 | Novak et al. | 355/53 |
| 5,668,672 | A | * | 9/1997 | Oomura | 359/727 |
| 5,689,377 | A | * | 11/1997 | Takahashi | 359/727 |
| 5,874,820 | A | * | 2/1999 | Lee | 318/575 |
| 2002/0080339 | A1 | * | 6/2002 | Takahashi | 355/72 |

* cited by examiner

Primary Examiner—Ricky Mack
(74) Attorney, Agent, or Firm—Finnegan, Henderson, Farabow, Garrett & Dunner, L.L.P.

(57) ABSTRACT

A retention system for securing a stage mirror to the wafer stage of a semiconductor manufacturing device includes at least one first bracket and at least one second bracket. The retention system rigidly secures the stage mirror to the wafer stage during movement of the wafer stage to reduce positional measurement errors. The at least one first bracket has a substantially planar first contact surface for engaging the reflective surface of the mirror. The first contact surface is a finished aluminum surface, which does not scratch the mirror surface. The at least one first bracket is formed with a gusset providing increased stiffness in the direction of movement of the wafer stage. The at least one second bracket includes an actuator for moving a substantially planar second contact surface into engagement with a rear surface of the mirror. In one embodiment, the actuator is a threaded fastener and the second contact surface is a finished polyimide resin tip. The actuator is securable in the position where the second contact surface engages the mirror. The first contact surface and the second contact surface apply opposing forces to the mirror along a substantially common line of action. The at least one second bracket further provides a flexible retention member engaging an upper surface of the mirror.

58 Claims, 9 Drawing Sheets

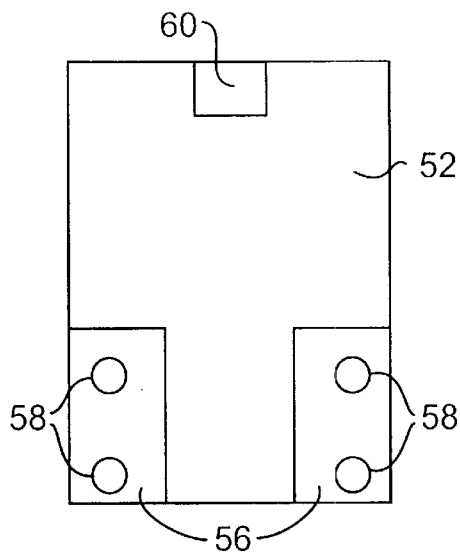
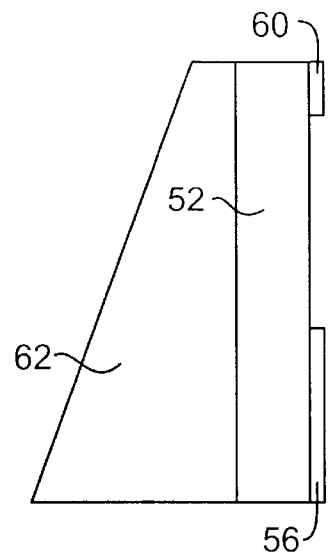
*FIG. 7A*  *FIG. 7B*
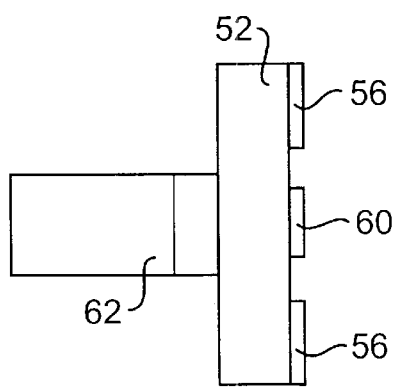
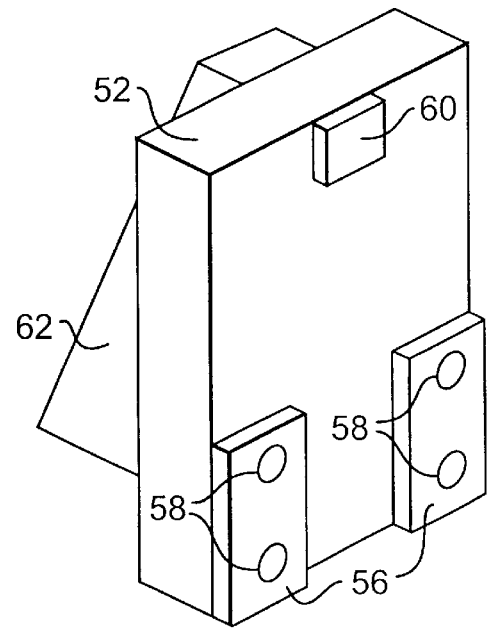
*FIG. 7C*  *FIG. 7D*

STAGE MIRROR RETENTION SYSTEM

BACKGROUND OF THE INVENTION

1. Field of the Invention

This invention relates to a retention system for a mirror and, more particularly, to a retention system for a stage mirror on the wafer stage of a projection exposure device for manufacturing semiconductor wafers using a photolithography process.

2. Description of the Related Art

Conventional devices for manufacturing integrated circuits utilize a photolithographic process to reproduce a circuit pattern from a reticle, or photomask, onto the surface of a wafer. In this process, radiant energy is transmitted through non-opaque portions of the reticle, through a projection exposure apparatus, and onto a surface of the wafer coated with photosensitized silicon or other semiconductor material. Conventional devices use visible and ultraviolet light as a radiant energy source. The portions of the wafer surface that are exposed to the light are cured. The uncured portion is then removed by an acid bath.

The resulting silicon layer is used to produce one layer of a multi-layered integrated circuit. A complete integrated circuit is formed by overlaying additional silicon layers on the existing layers. The overlay process involves recoating the wafer and repeating the exposure process using reticles with different circuit patterns.

The wafers used in this process contain multiple dies arranged in rows on the wafer surface. Each die is used to produce a separate integrated circuit. During manufacturing, a first circuit layer is formed on each die by reproducing the circuit pattern from the reticle on each die surface. Further circuit layers are formed by overlaying additional circuit patterns on the first circuit layer of each die.

In one conventional device, the wafer is mounted on the surface of a computer-controlled platform, or stage, which precisely positions the dies with respect to the projection exposure apparatus. After a die is exposed, the wafer stage sequentially moves the remaining dies into position for exposure. This device is known as a step-and-repeat exposure system, or a stepper.

Stepper devices use laser interferometers, which detect the position of a target, such as a stage mirror, to precisely determine and control the position of the wafer stage during manufacturing. It has been found that the stage mirror moves relative to the wafer stage during motion transients of the stage, such as stopping, starting, and directional changes. The motion of the stage mirror results in measurement errors, known as backstep errors, as the wafer stage moves dies into position for exposure, and alignment errors, known as overlay errors, as subsequent circuit layers are applied to the dies.

In order to reduce backstep and alignment errors, stainless steel holders have been used to secure the stage mirror on the wafer stage. These conventional holders each provide point contact with the mirror, with a first holder contacting the mirror's reflective surface and a second holder contacting the mirror's non-reflective, or rear surface. Point contact is provided by rounded contact elements. The contact element of the second holder is spring biased to hold it in contact with the mirror surface.

There are a number of problems associated with the conventional holders. First, the holders are not stiff enough to adequately restrain the mirror. As the wafer stage moves in a first direction, the holders flex, allowing the stage mirror to move in the opposite direction, leading to positional measurement errors. Stepper systems with the stainless steel holders have been unable to provide the positional tolerances required for the manufacturing of modern integrated circuits.

Further, the conventional holders have introduced several non-linear measurement errors for which the control computer cannot compensate. The contact point of the first holder has been found to scratch the mirror's reflective surface, causing surface imperfections. The contact point then moves over the mirror's surface in an erratic stick/slip fashion, introducing measurement inaccuracies.

Finally, the force from the contact point of the second holder has been found to be inadequate to prevent slippage of the mirror relative to the wafer stage. The use of stronger springs to increase the biasing force of this contact point merely increases the deflection of the first holder, while not reducing the slippage of the mirror.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and consistent with the principles of the invention, as embodied and broadly described herein, a first aspect of the invention is a retention system for securing a mirror to a mounting surface of a wafer stage movable along an axis, wherein the mirror includes a substantially planar reflective surface, a rear surface, and an exposed surface, and wherein the reflective surface is substantially perpendicular to the axis. The retention system includes at least one first bracket adapted to engage the wafer stage and the mirror to restrain motion of the mirror relative to the wafer stage in at least a direction parallel to the axis, the at least one first bracket comprising a substantially planar contact surface adapted to engage a first one of the reflective surface and the rear surface of the mirror, and at least one second bracket adapted to engage the wafer stage and the mirror to restrain motion of the mirror relative to the wafer stage in at least a direction parallel to the axis, the at least one second bracket comprising a substantially planar contact surface adapted to engage a second one of the reflective surface and the rear surface of the mirror.

In another aspect, the invention provides a retention system including a platform movable along an axis, the platform including a mounting surface, a detection member disposed on the mounting surface, the detection member including an upper surface, a lower surface, a forward surface, and a rear surface, wherein the forward surface is substantially planar and substantially perpendicular to the axis, at least one first bracket engaging the platform and the detection member to restrain motion of the detection member relative to the platform in at least a direction parallel to the axis, the at least one first bracket comprising a first contact surface engaging one of the forward surface and the rear surface of the detection member, and at least one second bracket engaging the platform and the detection member to restrain motion of the detection member relative to the platform in at least a direction parallel to the axis, the at least one second bracket comprising a second contact surface engaging the other of the forward surface and the rear surface of the detection member.

In a further aspect, the invention provides a method of securing a mirror to a mounting surface of a wafer stage movable along an axis, the method including providing a mirror including a substantially planar reflective surface, a rear surface, and an exposed surface, wherein the reflective surface is substantially perpendicular to the axis, engaging at least one first bracket with the wafer stage and the reflective surface to restrain motion of the mirror relative to the wafer stage in at least a direction substantially parallel to the axis, and engaging at least one second bracket with the wafer stage and the rear surface to restrain motion of the mirror relative to the wafer stage in at least a direction substantially parallel to the axis.

It is to be understood that both the foregoing general description and the following detailed description are exemplary and explanatory only and are not restrictive of the invention as claimed. Additional advantages will be set forth in the description which follows, and in part will be understood from the description, or may be learned by practice of the invention. The advantages and purposes may be obtained by means of the combinations set forth in the attached claims.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

FIGS. 7A, 7B, 7C, and 7D are front, side, top, and perspective views, respectively, of an embodiment of the first bracket of the present invention.

DESCRIPTION OF THE INVENTION

Figure 1:
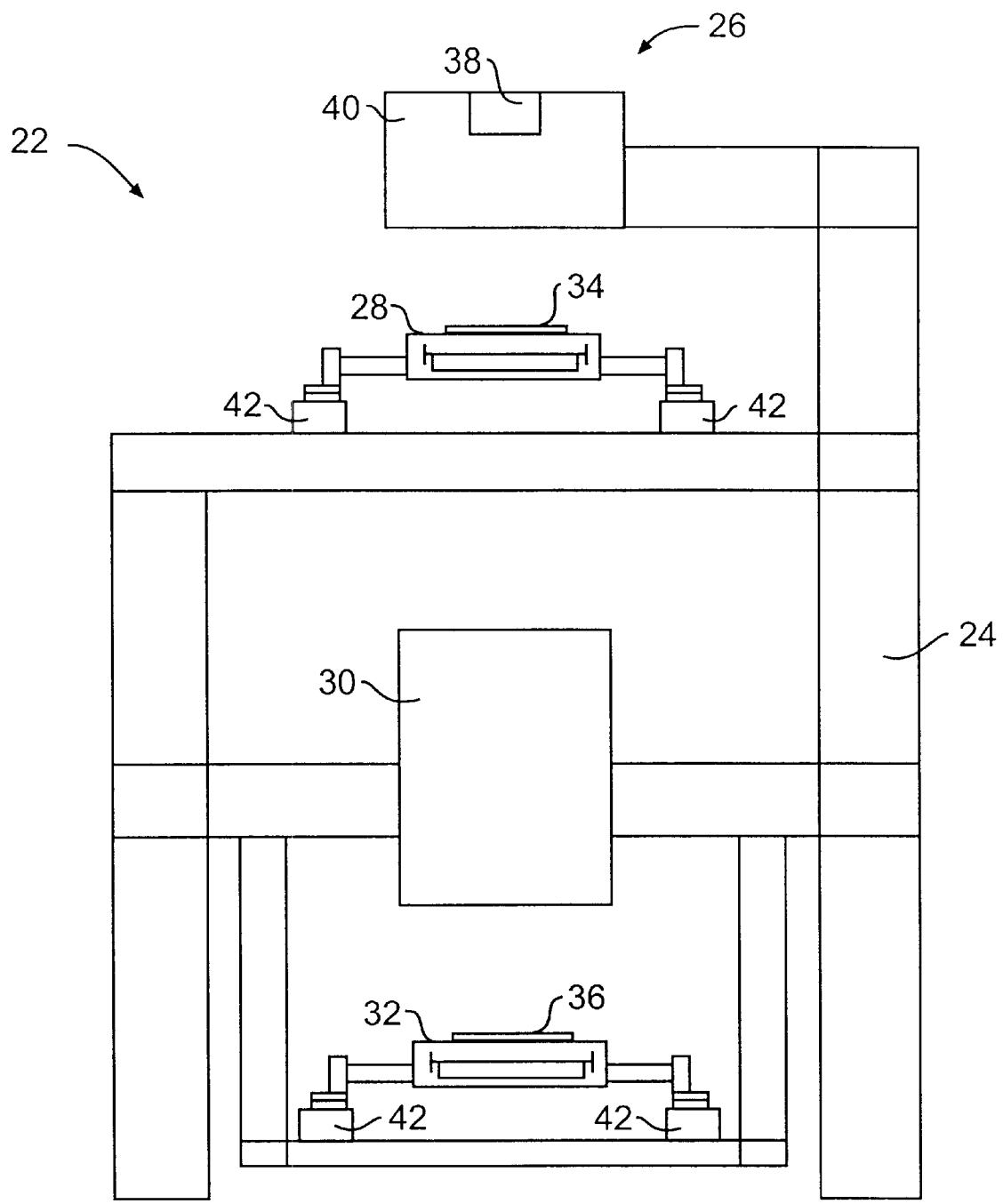
FIG. 1 is a largely schematic front elevation showing a semiconductor manufacturing device incorporating the retention system of the present invention.

Reference will now be made in detail to the embodiments of the assembly and method consistent with the principles of the present invention, examples of which are illustrated in the accompanying drawings. The invention will be further clarified by the following examples, which are intended to be exemplary of the invention. Wherever possible, the same reference numbers will be used throughout the drawings to refer to the same or like parts.

The retention system 20 of the present invention will be described with reference to the exposure apparatus 22 shown in FIG. 1. As shown, the exposure apparatus 22 includes a frame 24 supporting the components of the system, including an illumination system 26, a reticle stage 28, a lens assembly 30, and a wafer stage 32. The frame 24 is rigid and mounts to a base, such as the floor or another supporting structure. The design of the apparatus frame 24 may vary to suit the design requirements for the rest of the exposure apparatus 22. For example, separate individual structures (not shown) can be used to support the components of the system.

In operation, the exposure apparatus 22 utilizes the illumination system 26 to transfer a pattern of an integrated circuit from a reticle 34 mounted on the reticle stage 28, through the lens assembly 30, and onto a semiconductor wafer 36 mounted on the wafer stage 32. This process is described in detail below.

The illumination system 26 includes an illumination source 38 and an illumination optical assembly 40, as shown in FIG. 1. The illumination source 38 emits a beam of light energy. The illumination optical assembly 40 guides the beam of light energy from the illumination source 38 to the lens assembly 30. The beam selectively illuminates different portions of the reticle 34 and exposes the wafer 36. In FIG. 1, the illumination source 38 is illustrated as being supported above the reticle stage 28. Alternatively, the illumination source 38 can be secured to one of the sides of the apparatus frame 24 and the energy beam from the illumination source 38 can be directed above the reticle stage 28 with the illumination optical assembly 40.

The illumination source 38 can be a g-line light (436 nm), an i-line light (365 nm), a KrF excimer laser (248 nm), an ArF excimer laser (193 nm), or an $F_2$ laser (157 nm). Alternatively, the illumination source 38 can use a charged particle beam, such as an X-ray or an electron beam. In the case where an electron beam is used, thermionic emission-type lanthanum hexaboride ($LaB_6$) or tantalum (Ta) can be used as an electron gun. Further, in the case where an electron beam is used, the structure can be such that either a reticle is used, or a pattern is formed directly on the wafer without the use of a reticle.

The reticle stage 28 holds and precisely positions the reticle 34 relative to the lens assembly 30 and the wafer 36.

The lens assembly 30 projects and/or focuses the light passing through the reticle 34 to the wafer 36. Depending upon the design of the apparatus 22, the lens assembly 30 can reduce the image illuminated on the reticle 34 by varying amounts.

With respect to the lens assembly 30, when an excimer laser having far ultra-violet rays is used, glass materials such as quartz and fluorite that transmit far ultra-violet rays are preferably used. When an $F_2$ type laser or an X-ray is used, the lens assembly 30 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No, 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377, as well as Japan Patent Application Disclosure No.10-3039, also use a reflecting-refracting type of optical system incorporating a concave mirror, but without a beam splitter, and can also be employed with this invention. The disclosures in the above mentioned U.S. patents, as well as the Japan patent applications published in the Official Gazette for Laid-Open Patent Applications are incorporated herein by reference.

The wafer stage 32 holds and positions the wafer 36 with respect to the projected image of the illuminated portions of the reticle 34. In the embodiment illustrated in FIG. 1, the wafer stage 32 and the reticle stage 28 are positioned by a plurality of motors 42. Depending upon the design, the apparatus can also include additional servo drive units, linear motors, and planar motors to move the wafer stage 32 and the reticle stage 28.

When linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage can move along a guide, or it can be a guideless-type stage. The disclosures in U.S. Pat. Nos. 5,623,853 and 5,528,118 are incorporated herein by reference.

Alternatively, a stage can be driven by a planar motor, which drives the stage by the electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages, as described above, generates reaction forces which can affect performance of the photolithography system. Reaction forces generated by the wafer stage motion can be released mechanically to the floor by the use of a frame member as described in U.S. Pat. No. 5,528,118 and published Japanese Patent Application Disclosure No. 8-166475. Additionally, reaction forces generated by the reticle stage motion can be mechanically released to the floor by use of a frame member as described in U.S. Pat. No. 5,874,820 and published Japanese Patent Application Disclosure No. 8-330224. The disclosures in U.S. Pat. No. 5,874,820 and Japanese Patent Application Disclosure No. 8-330224 are incorporated herein by reference.

There are several different types of photolithographic devices. For example, the exposure apparatus 22 can be used as a scanning type photolithography system which exposes the pattern from the reticle 34 onto the wafer 36 with the reticle 34 and the wafer 36 moving synchronously. In a scanning type lithographic device, the reticle 34 is moved perpendicularly to an optical axis of the lens assembly 30 by the reticle stage 28 and the wafer 36 is moved perpendicularly to an optical axis of the lens assembly 30 by the wafer stage 32. Scanning of the reticle 34 and the wafer 36 occurs while the reticle 34 and the wafer 36 are moving synchronously.

Figure 2:
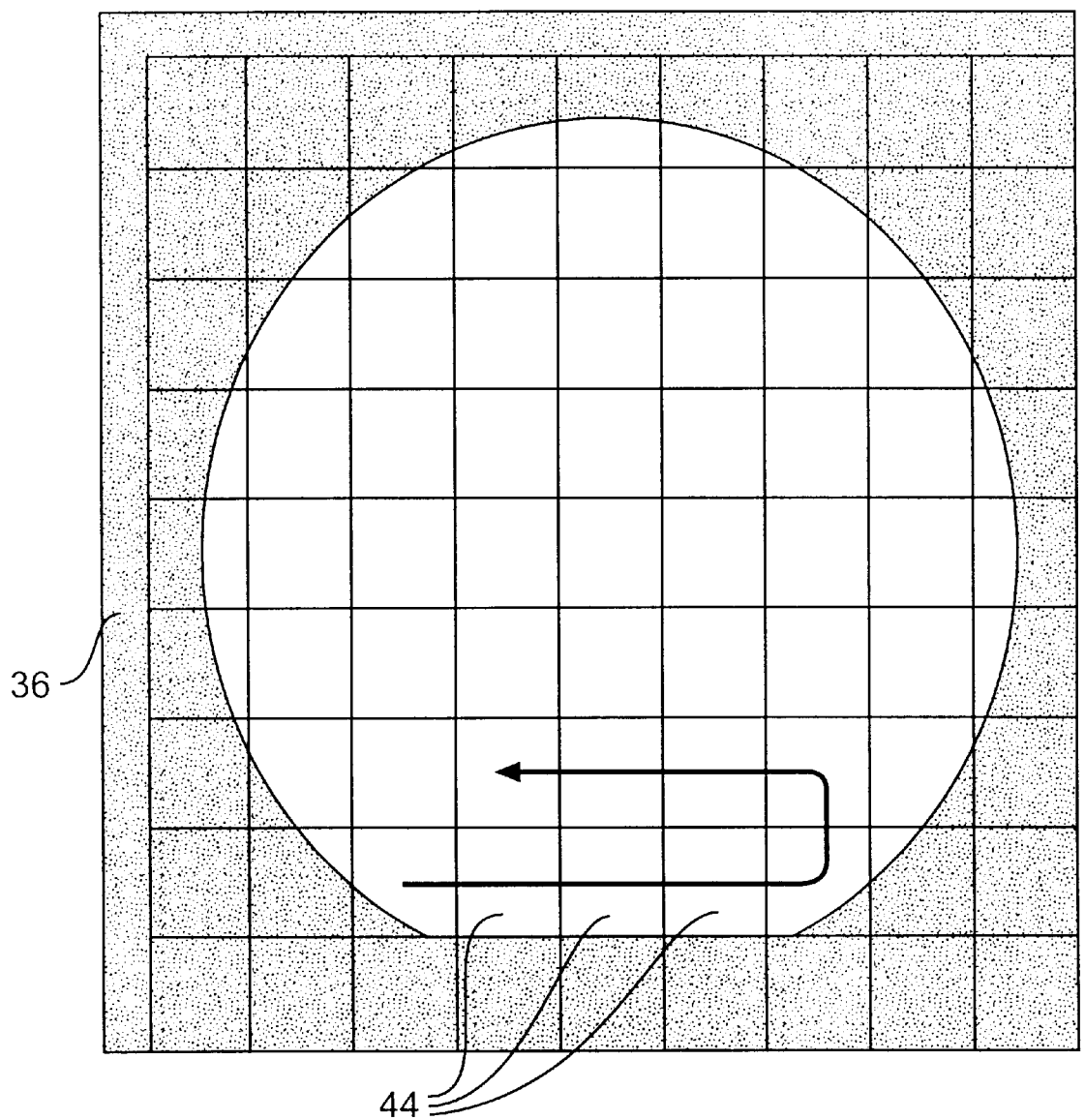
FIG. 2 is a schematic view of a semiconductor wafer showing the arrangement of dies on the surface of the wafer.

Alternatively, the exposure apparatus 22 can be a step-and-repeat type photolithography system, or stepper, that exposes the reticle 34 while the reticle 34 and the wafer 36 are stationary. In the step-and-repeat process, the wafer 36 is in a constant position relative to the reticle 34 and the lens assembly 30 during the exposure of an individual field, or die 44. The wafer 36 used with a stepper system has multiple dies 44 arranged on the surface of the wafer, as shown in FIG. 2.

Between exposure steps, the computer-controlled wafer stage 32 sequentially advances the wafer 36 perpendicularly to the optical axis of the lens assembly 30 so that the next die 44 is brought into position relative to the lens assembly 30 and the reticle 34 for exposure. The image on the reticle 34 is sequentially exposed onto the dies 44 of the semiconductor wafer 36 as each die 44 is brought into position. The wafer stage 32 advances the dies 44 for exposure in a boustrophedonic motion, wherein alternate rows are advanced in opposite directions. The motion of the wafer 36 is indicated by the arrow in FIG. 2.

Each exposed layer of a die 44 represents a single layer of a multi-layer integrated circuit. The exposure process is repeated to overlay additional circuit patterns on each die 44, whereby each die 44 is processed into a multi-layer integrated circuit.

Figure 3:
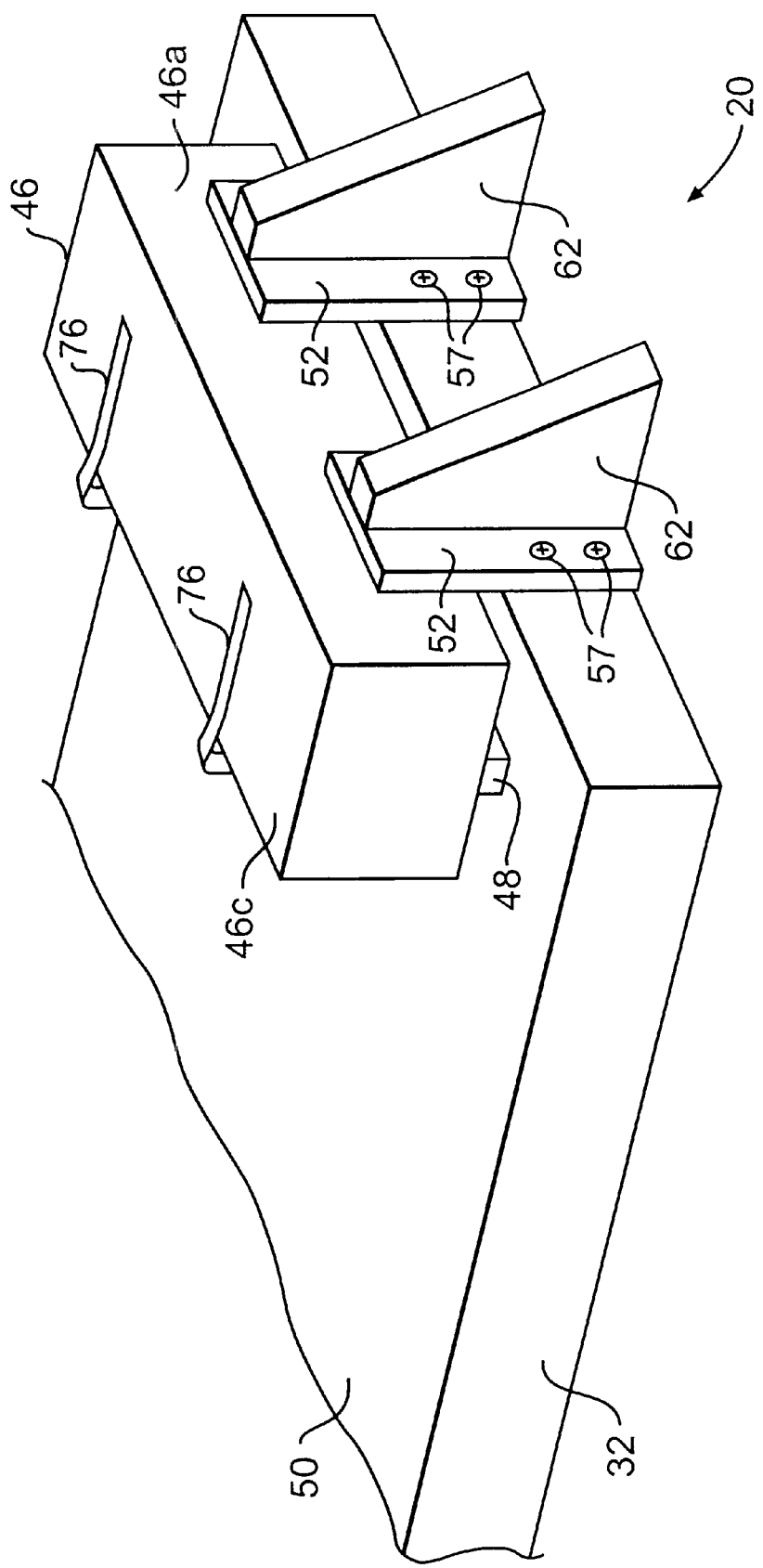
FIG. 3 is a fragmentary perspective view of a wafer stage utilizing an embodiment of the retention system of the present invention.

During the exposure process and the overlay process, precise positioning of the wafer stage 32 is necessary to achieve the required manufacturing tolerances. Stepper devices use laser interferometers, which detect the position of a detection member, such as a stage mirror 46, to precisely determine and control the position of the wafer stage 32 during manufacturing. Each stage mirror 46 can be used to detect the position of the wafer stage 32 in one of three orthogonal directions. Multiple stage mirrors 46 can be used to detect the position of the wafer stage 32 in multiple directions. A wafer stage 32 with a single stage mirror 46 is shown in FIG. 3. As shown, the stage mirror 46 is secured on the wafer stage 32 with an embodiment of the retention system 20 of the present invention.

Figure 4:
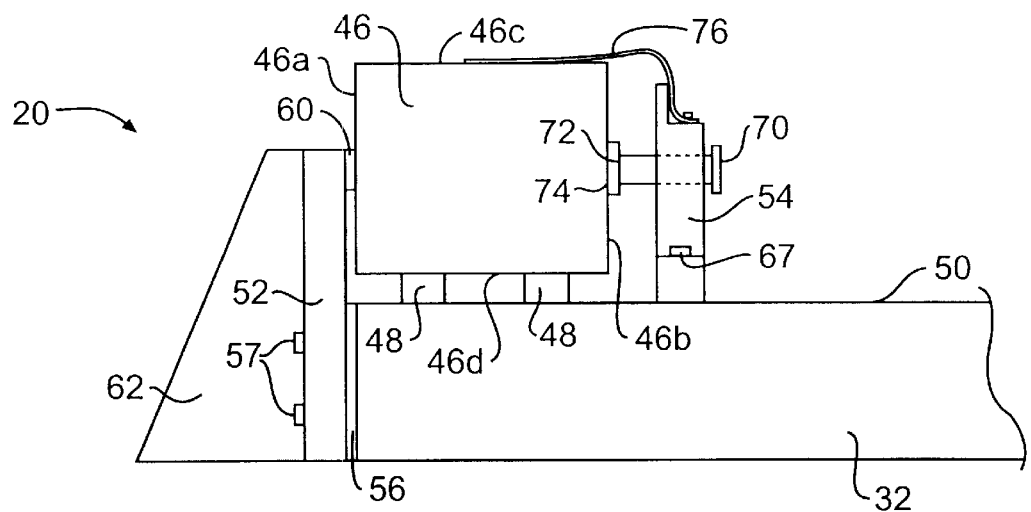
FIG. 4 is a fragmentary side view of a stage mirror secured with an embodiment of the retention system of the present invention.
Figure 5:
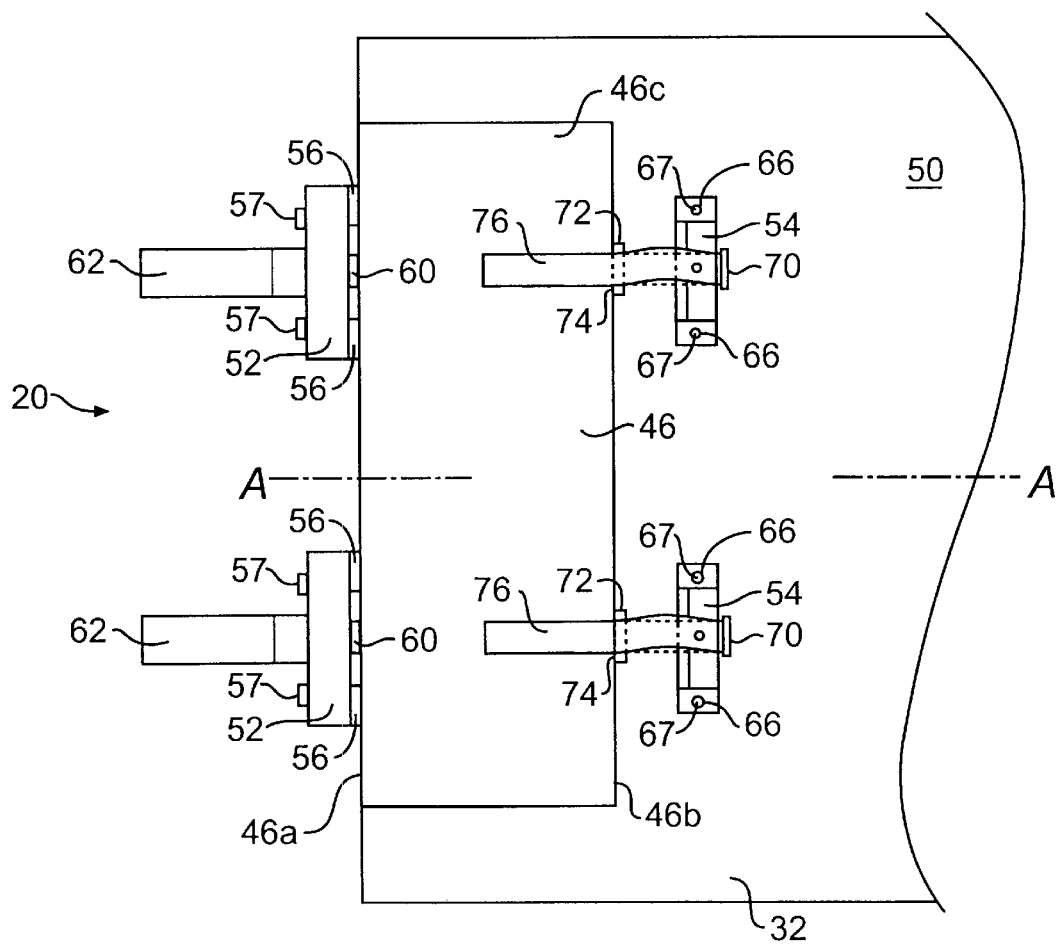
FIG. 5 is a fragmentary top view of the stage mirror of FIG. 4.

As further illustrated in FIGS. 4 and 5, the stage mirror 46 is disposed along an edge of the wafer stage 32, which is movable along an axis A. The stage mirror 46 has a forward, or reflective, surface 46a, a rear surface 46b, an upper, or exposed, surface 46c, and a lower surface 46d. The reflective surface 46a is substantially perpendicular to the axis A. At least one support projection 48 is disposed on the lower surface 46d of the stage mirror 46, where it contacts a mounting surface 50 of the wafer stage 32. The at least one support projection 48 has a substantially flat surface through which the stage mirror 46 contacts the wafer stage 32.

Figure 6B:
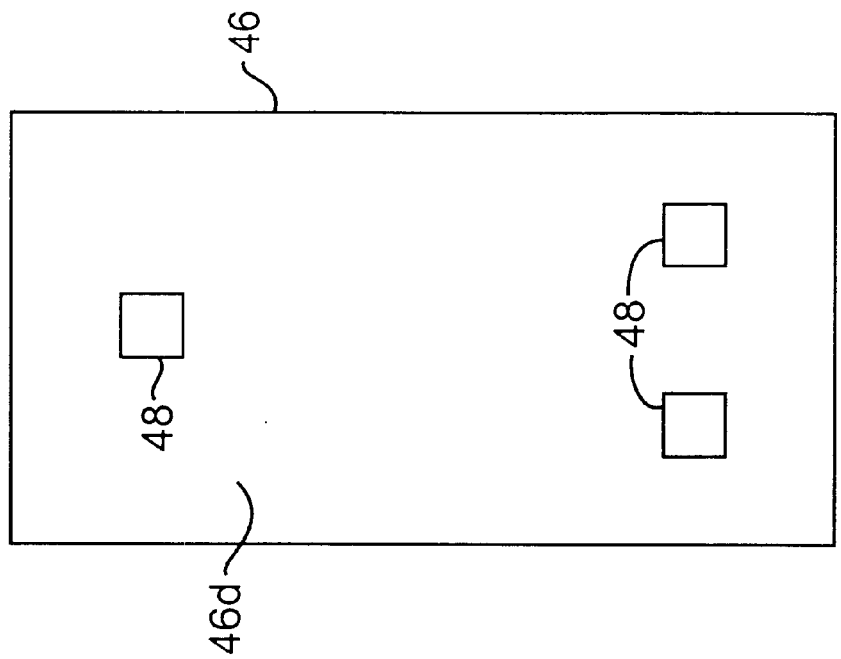
FIGS. 6A and 6B are bottom views of alternative stage mirrors used with the retention system of the present invention.
Figure 6A:
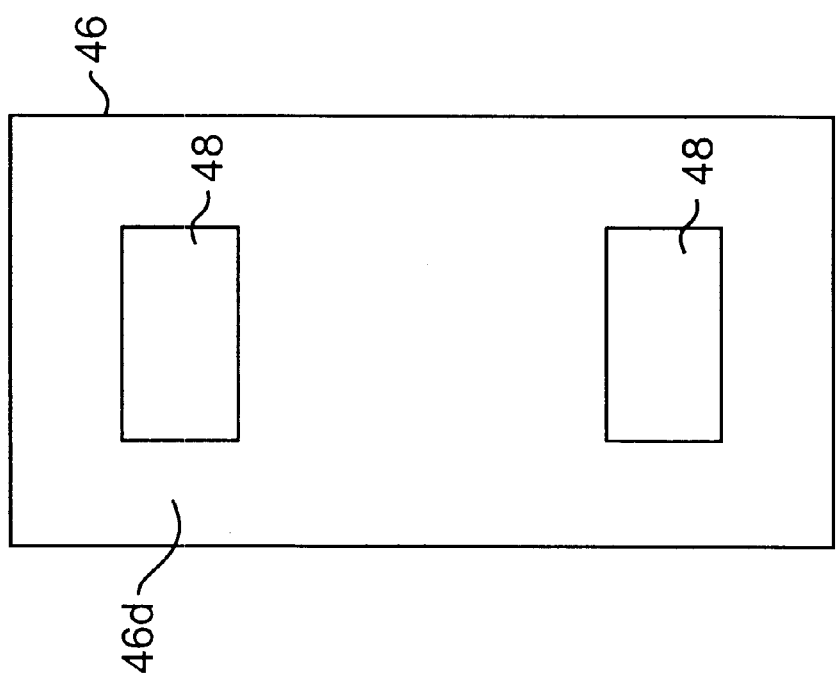
Figure 8A:
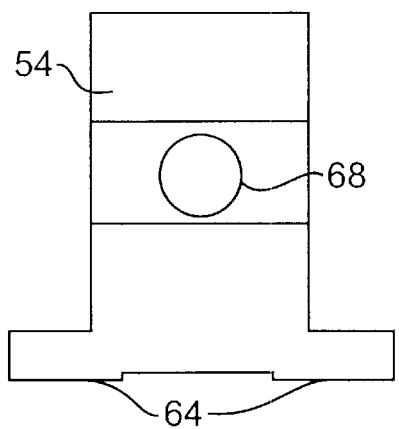
FIGS. 8A, 8B, 8C, and 8D are front, side, top, and perspective views, respectively, of an embodiment of the second bracket of the present invention.
Figure 8B:
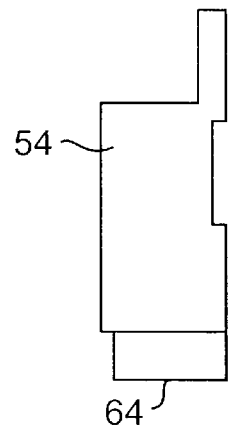
Figure 8C:
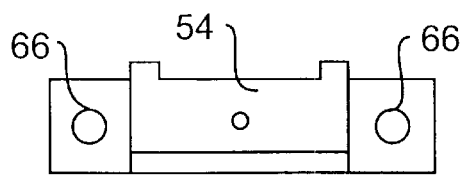
Figure 8D:
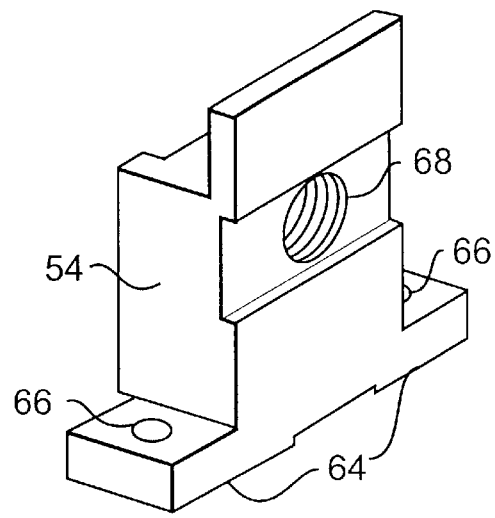

Different arrangements of support projections 48 can be used, as shown in FIGS. 6A and 6B. In one embodiment, there are two support projections 48 with a rectangular cross-section. In another embodiment, there are three support projections 48, each having a square cross-section.

In the embodiment shown in FIGS. 4 and 5, the stage mirror 46 is secured in place with two first brackets 52 and two second brackets 54. The brackets 52,54 are made from aluminum, although other materials with similar properties would perform equally well.

The first brackets 52 engage a surface of the wafer stage 32 and the reflective surface 46a of the mirror 46 to restrain motion of the mirror 46 relative to the wafer stage 32 in a direction substantially parallel to the axis A. Four views of the first bracket 52 are shown in FIGS. 7A–7D. As shown, two raised sections 56 are provided on the front face of the first bracket 52 to provide a flush fit with the wafer stage 32 surface. Through-holes 58 are provided in the raised sections 56 to receive fasteners 57 for securing the first bracket 52 to the wafer stage 32.

Contact between the first bracket 52 and the stage mirror 46 is made through a substantially planar first contact surface 60. In the embodiment shown in FIGS. 7A–7D, the first contact surface 60 has a square cross-section, but other shapes are considered within the scope of the invention. Due to the flatness of its finished surface, the first contact surface 60 does not scratch the mirror's reflective surface and is not affected by surface imperfections on the mirror 46. Therefore, the first bracket 52 does not introduce non-linear measurement errors.

Further, the first bracket 52 is formed with a gusset 62 that stiffens the bracket 52 in a direction substantially parallel to the axis A. Use of the gusset and an appropriately stiff material greatly increase the stiffness and rigidity of the retention system 20.

The second brackets 54 engage a surface of the wafer stage 32 and the rear surface 46b of the mirror 46 to restrain motion of the mirror 46 relative to the wafer stage 32 in a direction substantially parallel to the axis A, as shown in FIGS. 4 and 5. Four views of the second bracket 54 are shown in FIGS. 8A–8D. As shown, two raised sections 64 are provided on the bottom surface of the second bracket 54 to provide a flush fit with the wafer stage 32 surface. Through-holes 66 are provided in the raised sections 64 to receive fasteners 67 for securing the second bracket 54 to the wafer stage 32.

A threaded hole 68 is provided in the second bracket 54 to receive an actuator that can be selectively engaged with the rear surface 46b of the mirror 46 to secure the mirror 46 against the first bracket 52. In the embodiments of FIGS. 4 and 5, the actuator is a threaded fastener 70, although other suitable actuators are considered within the scope of the invention. The fastener 70 is provided with a polyimide resin tip 72, forming a substantially planar second contact surface 74 for engaging the mirror 46. Polyimide resin has been used because it is non-compressible and does not scratch the mirror surface, but other materials exhibiting similar properties would perform equally well. Further, a substantially circular second contact surface is shown, but other shapes are considered within the scope of the invention.

The fastener 70 can be operated to move the second contact surface 74 between a first position, where it engages the mirror 46, and a second position, where it is out of engagement with the mirror 46. The fastener 70 is securable in the first position with adhesive, a set screw, or other suitable securing means. Moving the fastener 70 into the first position causes the mirror 46 to be tightly engaged between the first and second brackets 52,54. With the mirror 46 engaged, the first contact surface 60 and the second contact surface 74 apply opposing forces to the mirror 46 along a substantially common line of action.

The second bracket 54 further includes a retention member 76 secured to an upper flange and engaging the exposed surface 46c of the mirror 46, as shown in FIGS. 4 and 5. In the embodiment shown, the retention member 76 is a flexible spring that applies a downward force on the mirror 46.

The retention system 20 of the present invention, therefore, rigidly secures the stage mirror 46 to the wafer stage 32 and reduces positional measurement errors. Further, the substantially planar, finished contact surfaces 60,74 engaging the mirror 46 obviate non-linear errors prevalent in conventional devices.

Figure 9:
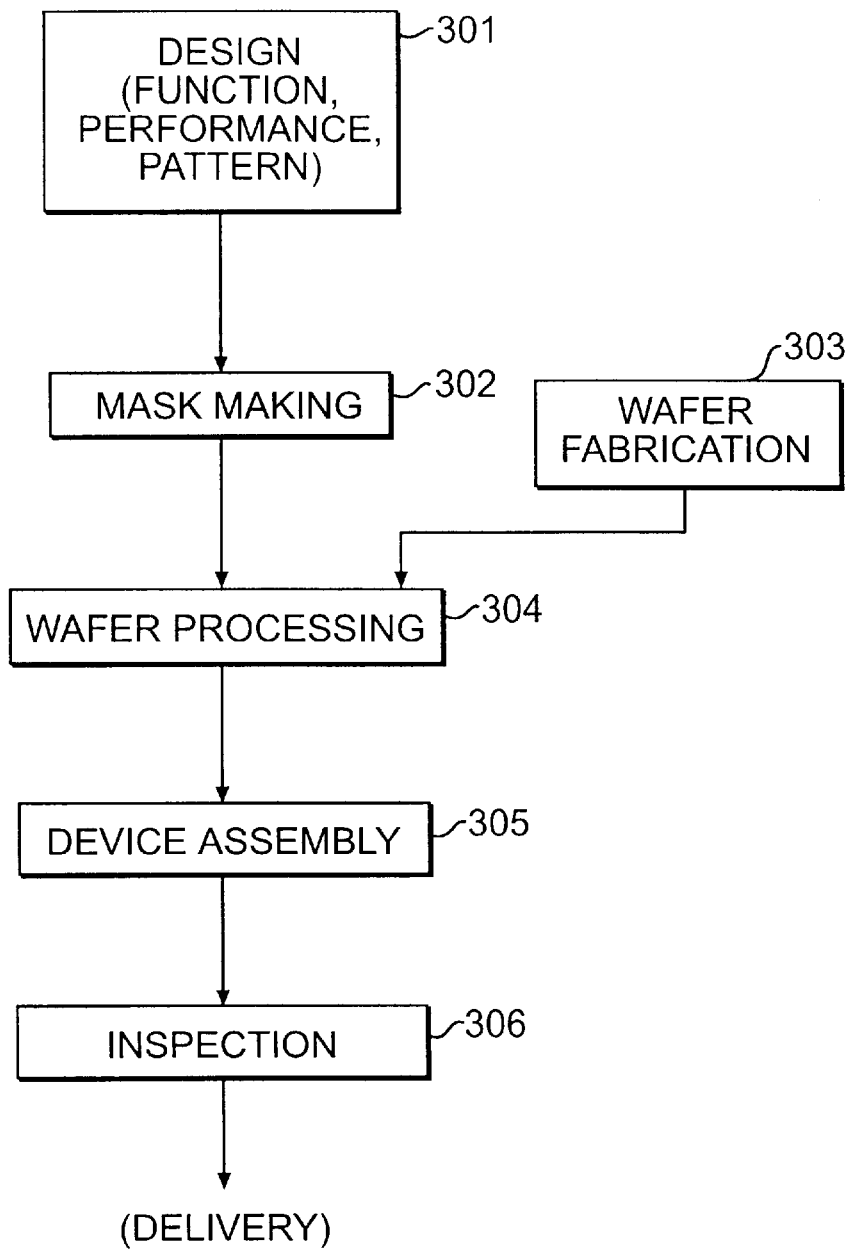
FIG. 9 is a flow chart outlining a process for manufacturing a semiconductor wafer consistent with the principles of the present invention.

The process of fabricating semiconductor devices will now be described with reference to the flowchart of FIG. 9. In step 301 the device's function and performance characteristics are designed. Next, in step 302, a reticle having a pattern is designed according to the previous designing step, and in a parallel step 303, a wafer is made from a silicon material. The reticle pattern designed in step 302 is exposed onto the wafer from step 303 in step 304 by a photolithography system described hereinabove consistent with the principles of the present invention. In step 305 the semiconductor device is assembled (including the dicing process, bonding process and packaging process). Finally, the device is inspected in step 306.

Figure 10:
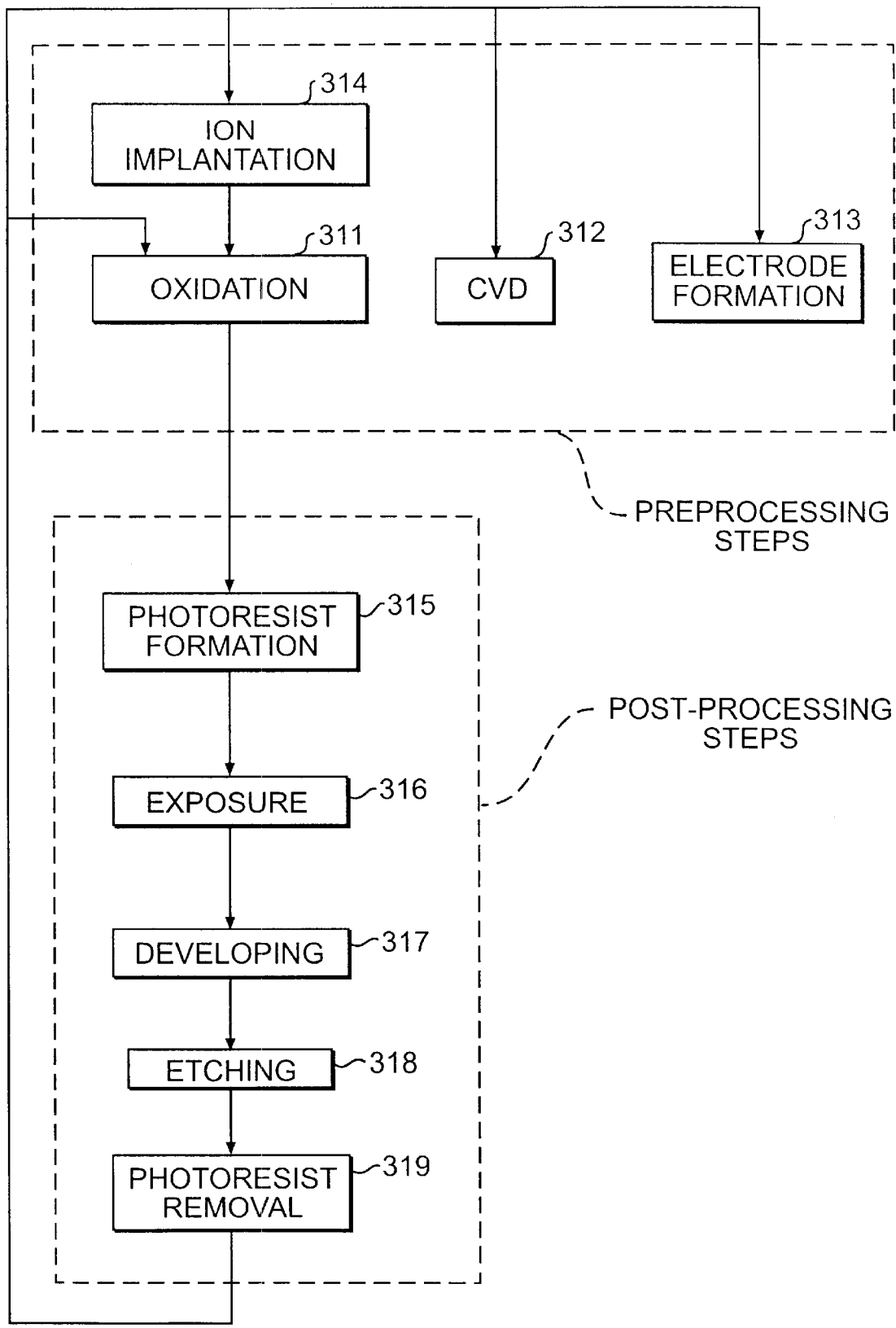
FIG. 10 is a flow chart outlining the semiconductor manufacturing process in more detail.

In the case of fabricating semiconductor devices, step 304 includes the additional steps detailed in the flowchart of FIG. 10. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the pre-processing steps for wafers during wafer processing, and selection is made at each step according to processing requirements.

At each stage of wafer processing, when the above mentioned preprocessing steps have been completed, the following post-processing steps are implemented. During post-processing, initially, in step 315 (photoresist formation step), a photoresist is applied to a wafer. Next, in step 316, (exposure step), the above mentioned exposure device is used to transfer the circuit pattern of a reticle to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these preprocessing and post-processing steps.

The use of the exposure apparatus provided herein is not limited to a photolithography system for manufacturing semiconductors. The exposure apparatus, for example, can be used as an LCD photolithography system that exposes a liquid crystal display device pattern onto a rectangular glass plate or a photolithography system for manufacturing a thin film magnetic head.

A photolithography system according to the above described embodiments can be built by assembling various subsystems, including each element listed in the appended claims, in such a manner that the prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes integrating mechanical interfaces, electrical circuit wiring connections and air pressure plumbing connections between each subsystem. There is also a process where each subsystem is assembled prior to assembling a photolithography system from the various subsystems. Once a photolithography system is assembled using the various subsystems, a total adjustment is performed to make sure that every accuracy is maintained in the complete photolithography system. Additionally, it is desirable to manufacture an exposure system in a clean room where the temperature and purity are controlled.

It will be apparent to those skilled in the art that various modifications and variations can be made in the lens cell assembly and the methods described, the material chosen for the present invention, and in construction of the photolithography systems as well as other aspects of the invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

What is claimed is:

1. A retention system for securing a mirror to a mounting surface of a wafer stage movable along an axis, wherein the mirror includes a substantially planar reflective surface, a rear surface, and an exposed surface, and wherein the reflective surface is substantially perpendicular to the axis, the retention system comprising:
   at least one first bracket adapted to engage the wafer stage and the mirror to restrain motion of the mirror relative to the wafer stage in at least a direction parallel to the axis, the at least one first bracket comprising a substantially planar contact surface adapted to engage a first one of the reflective surface and the rear surface of the mirror; and
   at least one second bracket adapted to engage the wafer stage and the mirror to restrain motion of the mirror relative to the wafer stage in at least a direction parallel to the axis, the at least one second bracket comprising a substantially planar contact surface adapted to engage a second one of the reflective surface and the rear surface of the mirror.

2. The retention system of claim 1, wherein the at least one first bracket further comprises a gusset stiffening the at least one first bracket in a direction substantially parallel to the axis.

3. The retention system of claim 1, wherein the contact surface of the at least one first bracket is adapted to engage the reflective surface of the mirror.

4. The retention system of claim 3, wherein the contact surface of the at least one first bracket is a finished aluminum surface.

5. The retention system of claim 1, wherein the at least one first bracket is aluminum.

6. The retention system of claim 1, wherein the at least one first bracket is two first brackets.

7. The retention system of claim 1, wherein the at least one second bracket further comprises an actuator for moving the contact surface of the at least one second bracket between a first position, where the contact surface engages the mirror, and a second position, where the contact surface is out of engagement with the mirror.

8. The retention system of claim 7, wherein the actuator is a threaded fastener.

9. The retention system of claim 8, wherein the threaded fastener is securable in the first position.

10. The retention system of claim 1, wherein the contact surface of the at least one second bracket is adapted to engage the rear surface of the mirror.

11. The retention system of claim 10, wherein the contact surface of the at least one second bracket is a finished polyimide resin surface.

12. The retention system of claim 1, wherein the at least one second bracket further comprises a flexible retention member adapted to engage the exposed surface of the mirror and to restrain motion of the mirror relative to the wafer stage in a direction substantially perpendicular to the mounting surface.

13. The retention system of claim 1, wherein the at least one second bracket is aluminum.

14. The retention system of claim 1, wherein the at least one second bracket is two second brackets.

15. The retention system of claim 1, wherein the contact surface of the at least one first bracket and the contact surface of the at least one second bracket are adapted to apply opposing forces to the mirror along a substantially common line of action.

16. A projection exposure system for manufacturing semiconductor wafers by a photolithography process utilizing the retention system of claim 1.

17. A retention system, comprising:
   a platform movable along an axis, the platform including a mounting surface;
   a detection member disposed on the mounting surface, the detection member including an upper surface, a lower surface, a forward surface, and a rear surface, wherein the forward surface is substantially planar and substantially perpendicular to the axis;
   at least one first bracket engaging the platform and the detection member to restrain motion of the detection member relative to the platform in at least a direction parallel to the axis, the at least one first bracket comprising a first contact surface engaging one of the forward surface and the rear surface of the detection member; and
   at least one second bracket engaging the platform and the detection member to restrain motion of the detection member relative to the platform in at least a direction parallel to the axis, the at least one second bracket comprising a second contact surface engaging the other of the forward surface and the rear surface of the detection member.

18. The retention system of claim 17, wherein the first contact surface is substantially planar.

19. The retention system of claim 18, wherein the forward surface of the detection member is reflective.

20. The retention system of claim 19, wherein the first contact surface engages the forward surface of the detection member.

21. The retention system of claim 20, wherein the first contact surface is a finished aluminum surface.

22. The retention system of claim 17, wherein the at least one first bracket further comprises a gusset stiffening the at least one first bracket in a direction substantially parallel to the axis.

23. The retention system of claim 17, wherein the at least one first bracket is aluminum.

24. The retention system of claim 17, wherein the at least one first bracket is two first brackets.

25. The retention system of claim 17, wherein the second contact surface is substantially planar.

26. The retention system of claim 25, wherein the second contact surface engages the rear surface of the detection member.

27. The retention system of claim 26, wherein the second contact surface is a finished polyimide resin surface.

28. The retention system of claim 17, wherein the at least one second bracket further comprises a retention member engaging the upper surface of the detection member to restrain motion of the detection member relative to the platform in a direction substantially perpendicular to the mounting surface.

29. The retention system of claim 28, wherein the retention member is flexible.

30. The retention system of claim 29, wherein the retention member is a spring.

31. The retention system of claim 17, wherein the at least one second bracket is aluminum.

32. The retention system of claim 17, wherein the at least one second bracket is two second brackets.

33. The retention system of claim 17, wherein the first contact surface and the second contact surface apply opposing forces to the detection member along a substantially common line of action.

34. The retention system of claim 17, wherein the at least one second bracket further comprises an actuator for moving the second contact surface between a first position, where the second contact surface is in engagement with the detection member, and a second position, where the second contact surface is out of engagement with the detection member.

35. The retention system of claim 34, wherein the actuator is a threaded fastener.

36. The retention system of claim 34, wherein the actuator is securable in the first position.

37. The retention system of claim 36, wherein the actuator is securable with adhesive.

38. The retention system of claim 36, wherein the actuator is securable with a set screw.

39. The retention system of claim 17, wherein the detection member comprises at least one support projection disposed on the lower surface and engaging the mounting surface of the platform.

40. The retention system of claim 39, wherein the at least one support projection includes a substantially flat surface engaging the mounting surface of the platform.

41. The retention system of claim 40, wherein the at least one support projection is one support projection.

42. The retention system of claim 41, wherein the support projection has a substantially rectangular cross-section.

43. The retention system of claim 40, wherein the at least one support projection is a plurality of support projections.

44. The retention system of claim 43, wherein the plurality of support projections is three support projections.

45. The retention system of claim 44, wherein the support projections have a substantially square cross-section.

46. A projection exposure system for manufacturing semiconductor wafers by a photolithography process utilizing the retention system of claim 17.

47. A method of securing a mirror to a mounting surface of a wafer stage movable along an axis, the method comprising:

providing a mirror including a substantially planar reflective surface, a rear surface, and an exposed surface, wherein the reflective surface is substantially perpendicular to the axis;

engaging at least one first bracket with the wafer stage and the reflective surface to restrain motion of the mirror relative to the wafer stage in at least a direction substantially parallel to the axis; and engaging at least one second bracket with the wafer stage and the rear surface to restrain motion of the mirror relative to the wafer stage in at least a direction substantially parallel to the axis.

48. The method of claim 47, wherein the at least one first bracket comprises a substantially planar contact surface through which the at least one first bracket engages the reflective surface of the mirror.

49. The method of claim 48, wherein the contact surface is a finished aluminum surface.

50. The method of claim 47, wherein the at least one second bracket comprises a substantially planar contact surface through which the at least one second bracket engages the rear surface of the mirror.

51. The method of claim 50, wherein the contact surface is a finished polyimide resin surface.

52. The method of claim 50, wherein the at least one second bracket further comprises:

an actuator for moving the contact surface between a first position, where the contact surface is in engagement with the rear surface of the mirror, and a second position, where the contact surface is out of engagement with the rear surface of the mirror; and securing means for securing the actuator in a position.

53. The method of claim 52, wherein engaging at least one second bracket with the wafer stage and the rear surface further comprises:

operating the actuator to move the contact surface from the second position to the first position.

54. The method of claim 53, further comprising:

securing the actuator in the first position with the securing means.

55. The method of claim 47, wherein the at least one second bracket comprises a flexible retention member.

56. The method of claim 55, further comprising:

engaging the flexible retention member with the exposed surface of the mirror to restrain motion of the mirror relative to the wafer stage in a direction substantially perpendicular to the mounting surface.

57. The method of claim 47, wherein the at least one first bracket is two first brackets.

58. The method of claim 47, wherein the at least one second bracket is two second brackets.

* * * * *